United States Patent
Arigong et al.

(10) Patent No.: US 10,236,833 B2
(45) Date of Patent: Mar. 19, 2019

(54) RF AMPLIFIER WITH DUAL FREQUENCY RESPONSE CAPACITOR

(71) Applicant: Infineon Technologies AG, Neubiberg (DE)

(72) Inventors: Bayaner Arigong, San Jose, CA (US); Richard Wilson, Morgan Hill, CA (US); Haedong Jang, San Jose, CA (US); Frank Trang, San Jose, CA (US); Timothy Canning, Morgan Hill, CA (US); Rongguo Zhou, Gilroy, CA (US); Bjoern Herrmann, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/667,195

(22) Filed: Aug. 2, 2017

(65) Prior Publication Data

US 2019/0044483 A1  Feb. 7, 2019

(51) Int. Cl.
  *H03F 3/14*  (2006.01)
  *H03F 1/56*  (2006.01)
  (Continued)

(52) U.S. Cl.
  CPC ............ *H03F 1/565* (2013.01); *H01L 23/66* (2013.01); *H03F 3/195* (2013.01);
  (Continued)

(58) Field of Classification Search
  CPC ... H03F 3/14; H03F 3/60; H03F 3/191; H03F 3/193
  (Continued)

(56) References Cited

U.S. PATENT DOCUMENTS 5,177,453 A * 1/1993 Russell .................. H03B 19/18
  330/136
6,734,728 B1 * 5/2004 Leighton ................. H01L 23/66
  257/401
(Continued)

FOREIGN PATENT DOCUMENTS

CN  205945655 U  2/2017
EP  3096353 A1  11/2016
(Continued)

OTHER PUBLICATIONS

Canning, Timothy et al., "Compact Class-F Chip and Wire Matching Topology", Specification of U.S. Appl. No. 15/386,039, filed Dec. 21, 2016, pp. 1-29.
(Continued)

Primary Examiner — Steven J Mottola
(74) Attorney, Agent, or Firm — Murphy, Bilak & Homiller, PLLC

(57) ABSTRACT

An RF package includes a metal flange, an RF input lead, an RF output lead, and an electrically conductive die attach area. An RF transistor that is configured to amplify an RF signal is mounted in the die attach area. The RF transistor includes an input terminal that is electrically coupled to the RF input lead, an output terminal that is electrically coupled to the RF output lead, and a reference potential terminal that is electrically connected to the die attach area. A first capacitor having one or more upper metal plates, and a dielectric region is mounted in the die attach area and is electrically coupled to the RF transmission path of the RF signal. The first capacitor is configured to simultaneously match an impedance of the RF transistor at a fundamental frequency of the RF signal and to filter a higher order harmonic of the fundamental frequency.

18 Claims, 3 Drawing Sheets

(51) Int. Cl.
*H03F 3/195* (2006.01)
*H01L 23/66* (2006.01)

(52) U.S. Cl.
CPC .......... *H01L 2223/6611* (2013.01); *H01L 2223/6655* (2013.01); *H03F 2200/222* (2013.01); *H03F 2200/225* (2013.01); *H03F 2200/387* (2013.01); *H03F 2200/391* (2013.01); *H03F 2200/451* (2013.01)

(58) Field of Classification Search
USPC .......................... 330/65, 66, 67, 68, 307
See application file for complete search history.

(56) References Cited

U.S. PATENT DOCUMENTS

| | | |
|---|---|---|
| 6,879,224 B2 | 4/2005 | Frank |
| 7,489,188 B2 | 2/2009 | Lee et al. |
| 7,760,027 B2 | 7/2010 | Murji et al. |
| 7,800,448 B2 | 9/2010 | Blednov |
| 8,193,857 B1 | 6/2012 | Wilson |
| 8,253,496 B2 | 8/2012 | Ichitsubo et al. |
| 8,593,219 B1 | 11/2013 | Root |
| 8,717,099 B2 | 5/2014 | Wilson et al. |
| 8,717,102 B2 | 5/2014 | Wilson et al. |
| 9,419,568 B2 | 8/2016 | Beltran et al. |
| 9,425,756 B2 | 8/2016 | Kesson et al. |
| 9,503,025 B2 | 11/2016 | Cao et al. |
| 9,673,766 B1 | 6/2017 | Roberts et al. |
| 2005/0242877 A1 | 11/2005 | Kusunoki et al. |
| 2008/0191801 A1 | 8/2008 | Kim et al. |
| 2010/0141168 A1 | 6/2010 | Zhang et al. |
| 2011/0230149 A1 | 9/2011 | Kuriyama et al. |
| 2015/0200631 A1 | 7/2015 | Outaleb |
| 2015/0243649 A1 | 8/2015 | Brech et al. |
| 2016/0105153 A1 | 4/2016 | Chen et al. |
| 2016/0142020 A1 | 5/2016 | Wang |
| 2016/0285421 A1 | 9/2016 | Matsuzuka et al. |
| 2017/0359032 A1 | 12/2017 | McLaren |
| 2017/0366148 A1 | 12/2017 | Jang et al. |
| 2017/0373645 A1 | 12/2017 | Jang et al. |

FOREIGN PATENT DOCUMENTS

| | | |
|---|---|---|
| WO | 2016057218 A1 | 4/2016 |
| WO | 2016207600 A1 | 12/2016 |

OTHER PUBLICATIONS

Goel, Saurabh et al., "LC Network for a Power Amplifier with Selectable Impedance", Specification of U.S. Appl. No. 15/078,298, filed Mar. 23, 2016, pp. 1-32.

Gozzie, Cristian et al., "Embedded Harmonic Termination on High Power RF Transistor", Specification of U.S. Appl. No. 15/421,567, filed Feb. 1, 2017, pp. 1-20.

Liu, Yang et al., "Semiconductor Package with Integrated Harmonic Termination Feature", Specification of U.S. Appl. 15/610,805, filed Jun. 1, 2017, pp. 1-26.

Chen, Kenle et al., "A 3.1-GHz Class-F Power Amplifier With 82% Power-Added-Efficiency", IEEE Microwave and Wireless Components Letters, vol. 23, No. 8, Aug. 2013, 436-438.

Chen, Kenle et al., "Design of Highly Efficient Broadband Class-E Power Amplifier Using Synthesized Low-Pass Matching Networks", Reprinted from IEEE Transactions on Microwave Theory and Techniques, vol. 59, No. 12, Dec. 2012, pp. 112.

Doherty, W. H., "A New High Efficiency Power Amplifier for Modulated Waves", Proceedings of the Institute of Radio Engineers, vol. 24, No. 9, Sep. 1936, pp. 1163-1182.

Gao, S et al., "High-efficiency power amplifier design including input harmonic termination", IEEE Microwave and Wireless Components Letters, vol. 16, Issue 2, Feb. 2006, pp. 81-83.

Jundi, A et al., "An 85-W Multi-Octave Push-Pull GaN HEMT Power Amplifier for High-Efficiency Communication Applications at Microwave Frequencies", IEEE Transactions on Microwave Theory and Techniques, vol. 63, Issue 11, Nov. 2015, pp. 3691-3700.

Mohadeskasaei, Seyed A. et al., "Design of Broadband, High-Efficiency, and High-Linearity GaN HEMT Class-J RF Power Amplifier", Progress in Electromagnetic Research C, vol. 72, 2017, pp. 177-186.

White, P M., "Effect of input harmonic terminations on high efficiency class-B and class-F operation of PHEMT devices", Microwave Symposium Digest, 1998 IEEE MTT-S International, Jun. 1998, pp. 1611-1614.

Wilson, Richard et al., "Enhanced Instantaneous Bandwidth LDMOS RF Power Transistor Using Integrated Passive evices", 2016 IEEE MTT-S International Microwave Symposium (IMS), May 22-27, 2016, 1-4.

Zhu, Ning et al., "An Integrated RF Match and Baseband Termination Supporting 395 MHz Instantaneous Bandwidth for High Power Amplifier Applications", 2017 IEEE MTT-S International Microwave Symposium (IMS), Jun. 4-9, 2017, 1114-1117.

\* cited by examiner

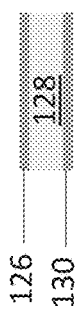
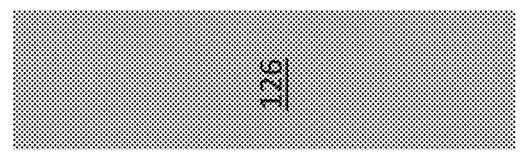
FIG 2D
FIG 2C
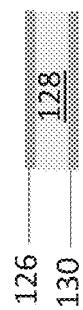
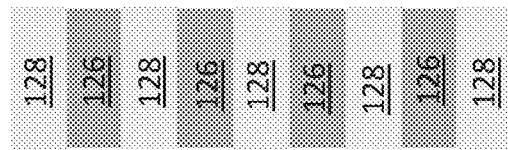
FIG 2B
FIG 2A
FIGURE 2

RF AMPLIFIER WITH DUAL FREQUENCY RESPONSE CAPACITOR

FIELD OF TECHNOLOGY

The present application relates to RF (radio frequency) amplifiers, and in particular relates to impedance matching networks for RF amplifiers.

BACKGROUND

RF power amplifiers are used in a variety of applications such as base stations for wireless communication systems, etc. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher. Many RF power amplifier designs utilize a semiconductor switching device as the amplification device. Examples of these switching devices include power transistor devices, such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), an LDMOS transistor, etc.

Class F amplifier configurations are gaining increased favor in modern RF applications due to their highly efficient operation. In class F operation, the input of the switching device (e.g., the gate) is modulated while a reference terminal of the switching device (e.g., the source) is maintained at a fixed potential. During the ON state of the switching device, voltage is ideally at zero across the output of the switching device while a sinusoidal switching current is present across the output terminal of the switching device. During the OFF state of the switching device, current is ideally at zero across the output of the switching device while a half square wave voltage appears at the output terminal of the switching device. Theoretically, no power is dissipated because both states are characterized by zero IV. In practice, power dissipation occurs at the transition between ON and OFF states when there is an overlap between the current sine wave and the voltage square wave and hence current and voltage simultaneously appear at the output terminal. Highly efficient class F operation is obtained by minimizing this overlap.

One technique for minimizing the current-voltage overlap in class F amplifiers involves harmonic filtering. By mitigating harmonic oscillation at the output of the device, the shapes the voltage and current waveforms are beneficially controlled for minimal overlap. For optimum efficiency, the output of the amplifier should include a short circuit path for even higher ordered harmonics (e.g., $2F_0$, $4F_0$, $6F_0$, etc) of the fundamental frequency $F_0$ of the RF signal being amplified.

Known techniques for harmonic tuning of Class F amplifiers include incorporating filters into the impedance matching networks that are connected to the input and output terminals of the amplifier device. These impedance matching networks can be provided on a printed circuit board (PCB) that accommodates the packaged amplifier device. Alternatively, or in addition, harmonic filters can be incorporated into the packaged amplifier device itself by placing discrete capacitors and inductors between the integrated circuit and the package leads.

Designers face several notable challenges with respect to tuning circuits for filtering higher ordered harmonics. For example, parasitic effects predominate at the higher frequencies that higher ordered harmonics occur at. Thus, as the filtering circuitry is separated from the current source by elements that contain non-negligible parasitic inductance, capacitance, etc., the ability to effectively tune out higher order harmonics becomes more difficult. Moreover, the inclusion of separate turning networks for higher order harmonics increases the size, cost and component count of the device.

SUMMARY

A packaged amplifier circuit is disclosed. According to an embodiment, the packaged amplifier circuit includes an RF package having a metal flange, an RF input lead extending away from one side of the metal flange, an RF output lead extending away from an opposite side of the metal flange, and an electrically conductive die attach area between the RF input and output leads. The packaged amplifier circuit further includes an RF transistor mounted in the die attach area. The RF transistor includes an input terminal that is electrically coupled to the RF input lead, an output terminal that is electrically coupled to the RF output lead, and a reference potential terminal that is electrically connected to the die attach area. The RF transistor is configured to amplify an RF signal as between the input and output terminals across an RF frequency range. A first capacitor is mounted in the die attach area. The first capacitor includes one or more upper metal plates, and a dielectric region between the upper metal plate and the die attach area. One or more first electrically conductive bond wires electrically couple the upper metal plate of the first capacitor to a conductive transmission path of the RF signal between the RF input and RF output leads. The first capacitor is configured to simultaneously match an impedance of the RF transistor at a fundamental frequency of the RF signal and to filter a higher order harmonic of the fundamental frequency, the fundamental frequency being within the RF frequency range.

An RF amplifier is disclosed. The RF amplifier includes an RF input port, an RF output port, a reference potential port, and an RF amplifier device. The RF amplifier device includes an input terminal that is electrically coupled to the RF input port, an output terminal that is electrically coupled to the RF output lead, and a reference potential terminal that is electrically connected to the reference potential port. The RF amplifier device is configured to amplify an RF signal as between the input and output terminals across an RF frequency range. The RF amplifier further includes a first capacitor having one or more upper metal plates, and a dielectric region beneath the upper metal plate. The RF amplifier further includes one or more first electrically conductive bond wires electrically coupling the upper metal plate of the first capacitor to a conductive transmission path of the RF signal between the RF input and RF output ports. The one or more first electrically conductive bond wires and the first capacitor collectively form a first LC circuit in the conductive transmission path. The first LC circuit is configured to match an impedance of the RF transistor at a fundamental frequency of the RF signal, the fundamental frequency being within the RF frequency range. An open circuit transmission line impedance of the one or more upper metal plates presents an RF short in the conductive transmission path at a higher order harmonic of the fundamental frequency.

A method of determining dimensions of a capacitor in an impedance matching network of an RF amplifier circuit is disclosed. According to an embodiment, an RF circuit having an RF input port, an RF output port, and a reference potential port is provided. An RF amplifier device having an input terminal that is electrically coupled to the RF input port, an output terminal that is electrically coupled to the RF output lead, and a reference potential terminal that is electrically connected to the reference potential port is provided. A first capacitor comprising one or more upper metal plates, and a dielectric region beneath the one or more upper metal plates is provided. The first capacitor is electrically coupled to a conductive transmission path of the RF signal between the RF input and RF output ports. The RF amplifier device is operated to amplify an RF signal as between the RF input port and the RF output port across an RF frequency range. An impedance presented by the one or more upper metal plates during the operation of the RF amplifier is measured. A physical geometry of the one or more upper metal plates in which the one or more upper metal plates presents an RF short at a frequency that is within or higher than the RF frequency range is determined.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A, 2B, 2C and 2D, depicts two different embodiments of the dual frequency response capacitor, according to an embodiment.

FIGS. 2A and 2B depict, respectively, a cross-sectional view and a plan view of a dual frequency response capacitor with a single continuous upper metal plate. FIGS. 2C and 2D depict, respectively, a cross-sectional view and a plan view of a dual frequency response capacitor with a plurality of upper metal plates that are separated from one another.

DETAILED DESCRIPTION

According to embodiments described herein, a packaged amplifier circuit is provided. The packaged amplifier circuit includes, among other things, a metal flange with input and output leads, and a die attach area disposed between the input and output leads. An RF transistor, such as a GaN HEMT device, is mounted on the metal flange in a source-down configuration. The RF transistor is electrically coupled to the input and output leads by impedance matching networks that include inductors and capacitors.

Advantageously, at least one of the impedance matching networks includes a single capacitor that is configured to simultaneously match an input or output impedance of the RF transistor at the fundamental operating frequency $F_0$ and to filter a higher order harmonic component of the fundamental frequency $F_0$. Impedance matching is provided from the parallel plate capacitance of the single capacitor which, in combination with inductors, provides a parallel resonator with the impedance of the RF transistor at the fundamental frequency $F_0$. Harmonic filtering is provided by an open circuit transmission line impedance of the upper metal plate of the capacitor. That is, the upper metal plate (or plates) of the capacitor is formed with a geometry that acts as a series resonator (i.e., appear as an electrical short from an RF perspective) at the higher order harmonic of the fundamental frequency $F_0$.

These embodiments provide a simple, cost-effective solution for providing a packaged amplifier circuit with impedance matching and harmonic filtering. Because the capacitor is integrated within the package and is disposed very close to the current source of the amplifier (i.e., the drain in the above discussed example), high quality harmonic filtering with minimal distortion is achieved. Moreover, because the single dielectric capacitor simultaneously provides both impedance matching and harmonic filtering, package size is reduced, component count is reduced, and cost can be reduced in comparison to other solutions that utilize separate capacitors to provide impedance matching and harmonic filtering.

Figure 1:
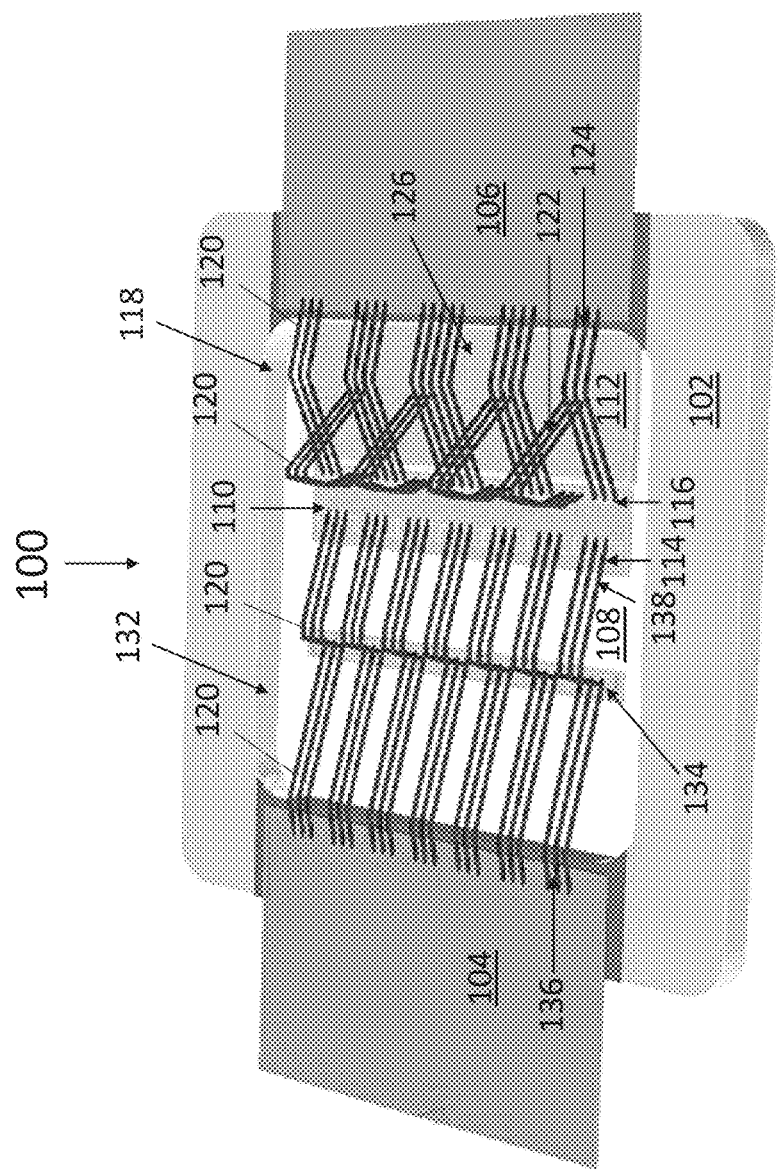
FIG. 1 depicts a packaged amplifier circuit with a dual frequency response capacitor, according to an embodiment.

Referring to FIG. 1, a packaged RF amplifier 100 is depicted, according to an embodiment. The packaged RF amplifier 100 is configured to interface with an external circuit, such as a printed circuit board. The packaged RF amplifier 100 includes a metal flange 102, an electrically conductive RF input lead 104 extending away from one side of the metal flange 102, and an electrically conductive RF output lead 106 extending away from an opposite side of the metal flange 102 as the RF input lead 104. The metal flange 102 includes a planar die attach area 108 that is adapted for the mounting of one or more integrated circuit components thereon. According to an embodiment, the planar die attach area 108 electrically connects to an externally accessible reference potential terminal or lead of the packaged RF amplifier 100. For instance, an underside of the flange 102 may provide an externally accessible reference potential terminal of the packaged RF amplifier 100. The RF input lead 104 and the RF output lead 106 may be disposed on an electrically insulating window frame that is disposed around the periphery of the die attach area 108 and electrically insulates the RF input lead 104 and the RF output lead 106 from the flange 102.

An RF transistor 110 is mounted in the die attach area 108. The RF transistor 110 is configured to amplify an RF signal across an RF frequency range. For exemplary purposes, the following discussion will use an RF frequency range of 1.8 GHz and 2.2 GHz, with a center frequency of 2.0 GHz (i.e., the fundamental frequency $F_0$). More generally, the RF transistor 110 can operate in a wide variety of frequency ranges that are suitable in various RF applications, including frequencies in the 400 megahertz (MHz) to 60 gigahertz (GHz) range.

The RF transistor 110 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc., and more generally any type of RF transistor 110 device. According to an embodiment, the RF transistor 110 is a GaN based HEMT device.

The RF transistor 110 includes an input terminal 114, an output terminal 116, and a reference potential terminal 117 (not shown in FIG. 1). In the embodiments in which the RF transistor 110 is configured as a MOSFET, the input terminal 114 can correspond to the gate of the RF transistor 110, the output terminal 116 can correspond to the drain of the RF transistor 110, and the reference potential terminal 117 can correspond to the source of the RF transistor 110. In the depicted embodiment, the reference potential terminal 117 of the RF transistor 110 is disposed on a bottom side of the RF transistor 110 that directly faces the die attach area 108 and is electrically connected to the die attach area 108, e.g., by a conductive paste. The input and output terminals 114, 116 are disposed on a top side of the RF transistor 110 that is opposite the bottom side.

The packaged RF amplifier 100 further includes an output impedance matching network 118 electrically coupling the output terminal 116 of the RF transistor 110 to the RF output lead 106. The output impedance matching network 118 includes a first capacitor 112 mounted in the die attach area 108 between the RF transistor 110 and the RF output lead 106. The output impedance matching network 118 further includes electrically conductive bond wires 120 that provide an electrical connection between the output terminal 116, the first capacitor 112, and the RF output lead 106. More particularly, a first set 122 of electrically conductive bond wires 120 is directly electrically connected between the output terminal 116 of the RF transistor 110 and the first capacitor 112, and a second set 124 of electrically conductive bond wires 120 is directly electrically connected between the output terminal 116 and the RF output lead 106.

The first capacitor 112 includes at least one upper metal plate 126 that is disposed on a dielectric region 128 (shown in FIG. 2). The upper metal plate 126 directly faces and electrically connects with the electrically conductive bond wires 120. The first capacitor 112 may also include a lower metal plate 130 (shown in FIG. 2) that directly faces and electrically connects with the die attach area 108. The upper metal plate 126 provides one terminal of the first capacitor 112 and the lower metal plate 130 provides a second terminal of the first capacitor 112, wherein the first capacitor 112 is configured to store a voltage across these terminals in a conventionally known manner.

Referring to FIG. 2, various embodiments of the first capacitor 112 are depicted. A first embodiment of the first capacitor 112 is shown in FIGS. 2A and 2B. FIG. 2A depicts a cross-sectional view of the first capacitor 112, according to the first embodiment, and FIG. 2B shows a plan view of the first capacitor 112, according to the first embodiment. FIG. 2C depicts a cross-sectional view of the first capacitor 112, according to the second embodiment, and FIG. 2D shows a plan view of the first capacitor 112, according to the second embodiment.

In the first embodiment, the first capacitor 112 includes a single continuous upper metal plate 126 that covers the dielectric region 128. The upper metal plate 126 may span the entire length and width of the dielectric region 128 so as to completely cover the dielectric region 128. In this way, maximal capacitance per area occupied by the first capacitor 112 is achieved.

In the second embodiment, the upper metal plate 126 of the first capacitor 112 is provided by a plurality of discrete metal plates 126 that each cover a portion of the dielectric region 128 and are separated from one another by gaps in which the dielectric region 128 is not covered by a conductor. That is, the upper metal plate 126 of the first capacitor 112 is interrupted in certain regions so as to uncover certain portions of the dielectric regions 128. According to an embodiment, the discrete metal plates 126 of the plurality are completely isolated from one another.

Referring again to FIG. 1, the second set 124 of bond wires that are directly connected between the output terminal 116 of the RF transistor 110 and the RF output lead 106 are disposed over the first capacitor 112. One advantage obtained by the second embodiment of the first capacitor 112 as shown in FIGS. 2C and 2D is reduced capacitive coupling between the bond wires of the packaged amplifier and the upper metal plate 126 of the first capacitor 112. As the second set 124 of electrically conductive bond wires 120 extends directly over the first capacitor 112, the potential exists for electromagnetic interference between the upper metal plate 126 of the first capacitor 112 and the second set 124 of electrically conductive bond wires 120. The second embodiment of the first capacitor 112 substantially mitigates this issue by providing a conduit region above the first capacitor 112 that is substantially not influenced by the electric field of the upper metal plate 126 of the first capacitor 112. The second set 124 of electrically conductive bond wires 120 can be arranged to extend directly above the gaps that separate the plurality of discrete metal plates 126. Each of the discrete metal plates 126 of the upper metal plate 126 of the first capacitor 112 can be directly connected to bond wires of the first set 122 that are laterally adjacent to the second set 124.

The packaged RF amplifier 100 further includes an input impedance matching network 132 electrically coupling the RF input lead 104 to the input terminal 114 of the RF transistor 110. The input impedance matching network 132 includes a second capacitor 134 mounted in the die attach area 108 between the RF input lead 104 and the RF transistor 110. The input impedance matching network 132 further includes electrically conductive bond wires 120 that provide an electrical connection between the RF input lead 104, the second capacitor 134 and the input terminal 114 of the RF transistor 110. More particularly, a third set 136 of electrically conductive bond wires 120 is directly electrically connected between the RF input lead 104 and the second capacitor 134, and a fourth set 138 of electrically conductive bond wires 120 is directly electrically connected between the second capacitor 134 and the input terminal 114 of the RF transistor 110.

The second capacitor 134 can be configured as a so-called "chip-capacitor." The substrate of such a capacitor can include semiconductors such as silicon, silicon germanium, silicon carbide, etc., or alternatively can include insulators such as ceramic, plastic, etc. Any of these materials can act as the dielectric insulator in a parallel plate capacitor configuration. The second capacitor 134 includes an upper conductive terminal (e.g., a metal bond pad) that directly faces and electrically connects with the electrically conductive bond wires 120. The second capacitor 134 may also include a lower conductive terminal (e.g., a metal bond pad) (not shown) that directly faces and electrically connects with the die attach area 108.

The basic working principle of the packaged RF amplifier 100 is as follows. An unamplified version of an RF signal is received at the RF input lead 104. The unamplified version of the RF signal propagates across the third and fourth sets 136, 138 of electrically conductive bond wires 120 to the input terminal 114 of the RF transistor 110. The RF transistor 110 produces an amplified version of the RF signal at the output terminal 116. The amplified version of the RF signal propagates from the output terminal 116 of the RF transistor 110 across the second set 124 of electrically conductive bond wires 120 to the RF output lead 106. Additionally, the amplified version of the RF signal propagates across the first set 122 of the electrically conductive bond wires 120 to the upper metal plate 126 of the first capacitor 112.

Figure 3:
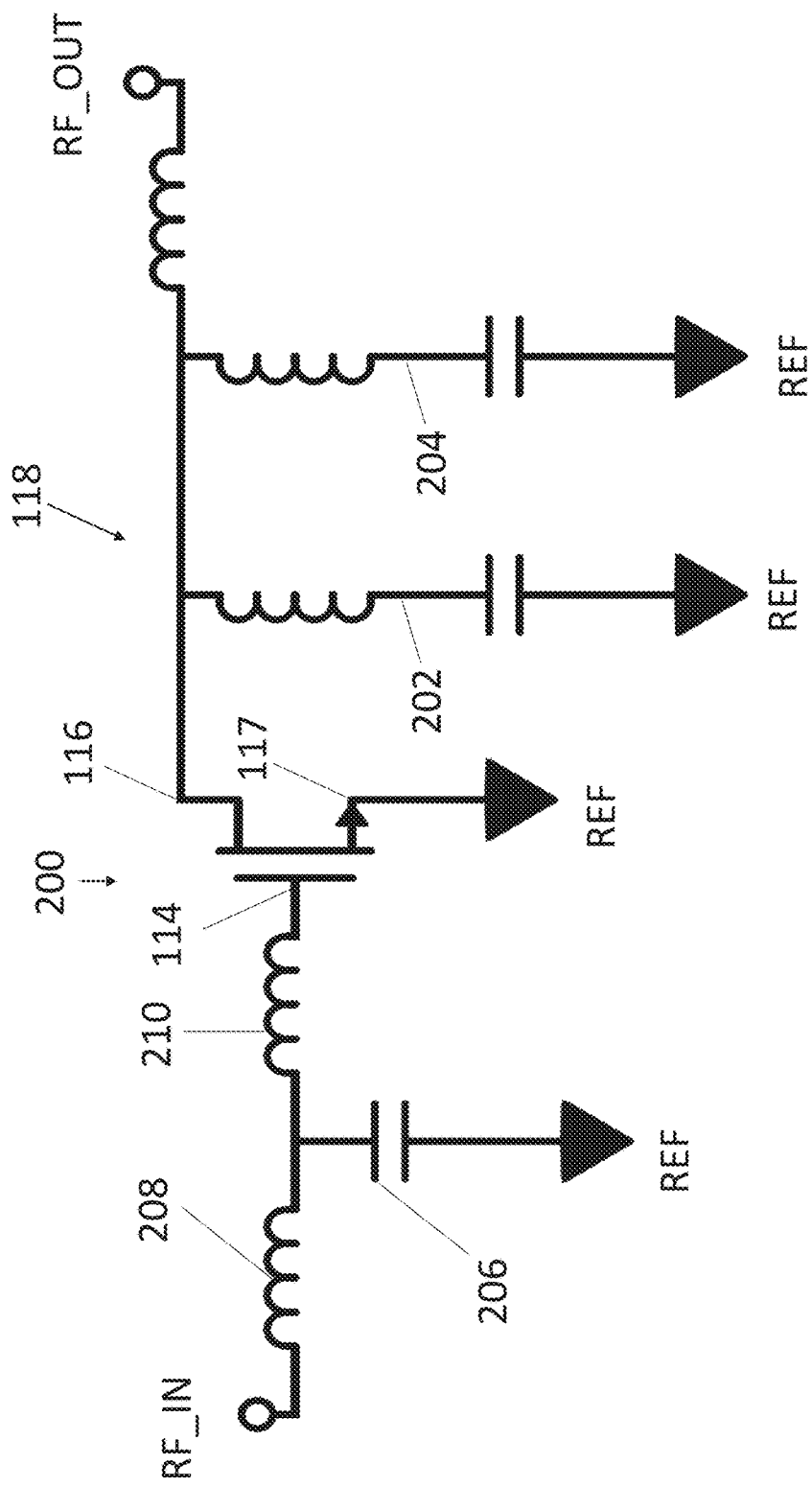
FIG. 3 depicts a schematic an RF amplifier circuit with an equivalent impedance presented by the dual frequency response capacitor corresponding to two discrete parallel LC branches at the output of the amplifier device.

Referring to FIG. 3, a circuit schematic of an RF amplifier device 200 is depicted, according to an embodiment. The circuit schematic of the amplifier device 200 can represent a schematic of the packaged RF amplifier 100 described with reference to FIGS. 1 and 2, wherein the RF input port (RF_IN) corresponds to the RF input lead 104, the RF output port (RF_OUT) corresponds to RF output lead 106, the reference potential port (REF) corresponds to the reference potential terminal (e.g., the flange 102 potential connection), and the RF transistor 110 provides the RF amplifier device of the circuit.

At the output side of the RF amplifier device 200, the output impedance matching network 118 described with reference to FIG. 1 is represented by a plurality of inductors and capacitors connected between the output terminal 116 of the amplifier device and the RF output port (RF_OUT) of the amplifier circuit. The output impedance matching network 118 includes a first LC branch 202 that is connected to the conductive transmission path of the RF signal, and a second LC branch 204 that is connected to the conductive transmission path of the RF signal. Both the first LC branch 202 and the second LC branch 204 are connected in parallel with the output terminal 116 and the reference potential terminal 117 of the RF transistor 110. That is, the first and second LC branches 204, 206 form parallel branches of the output impedance matching network 118.

The first LC branch 202 is configured to provide impedance matching to the output impedance of the RF amplifier device at the fundamental frequency of the RF signal. That is, the parameters of the first LC branch 202 (i.e., inductance and capacitance) are tailored for optimum power transfer of the RF signal at the fundamental frequency between the output terminal 116 and the RF output port (RF_OUT). According to one technique, the capacitance of the first LC branch 202 is sufficiently large to effectively appear as an open at the fundamental frequency. In the exemplary fundamental frequency of 2.0 GHz, the capacitance of the first LC branch 202 can be at least 100 pF, and is about 160-200 pF according to one embodiment. With this capacitance value, the inductance of the first LC circuit is tailored to form a parallel resonant circuit in combination with the parasitic output capacitance of the RF transistor 110 at the fundamental frequency. This parallel resonant circuit presents a high impedance to the RF signal at the fundamental frequency and consequently delivers substantially all of the output power of the amplified RF signal to the RF output port (RF_OUT) of the RF amplifier device 200.

The second LC branch 204 is configured as a filter that electrically shunts higher order harmonic components of the RF signal to the reference potential (e.g., GND). That is, the parameters of the second LC branch 204 (i.e., inductance and capacitance) are tailored to present a very low impedance at the higher order harmonics of the fundamental frequency (e.g., 4.0 GHz, 6.0 GHz, 8.0 GHz for the exemplary fundamental frequency of 2.0 GHz) and present a very high impedance outside of this specific frequency value. According to one particular embodiment, the second LC branch 204 is configured to resonate at a second order harmonic of the fundamental frequency. That is, the second LC branch 204 provides a series resonant circuit in the output impedance matching network 118 that filters out the second order harmonic of the fundamental frequency. If, for instance, the fundamental frequency of the RF is 2.0 GHz, this means that the second LC circuit appears as an electrical short to the reference potential at 4.0 GHz.

The inductances of the output impedance matching network 118, with the exception of the inductance of the second LC branch 204 that will be discussed in further detail below, are provided by the electrically conductive bond wires 120. As those of ordinary skill will appreciate, there is a certain inductance associated with any wire connection. Thus, each span of bond wires extending between two conductive terminals provides a defined inductance. This inductance value can be adjusted by tailoring the physical parameters of the spans of the bond wires. Exemplary physical parameters that can be tailored to achieve a desired inductance include height of the bond wires, separation distance between the bond wires, length of the spans of the bond wires, to name a few. The inductance of the first LC branch 202 corresponds to the inductance of the first set 122 of electrically conductive bond wires 120 connected between the output terminal 116 of the RF transistor 110 and the upper metal plate 126 of the first capacitor 112 as shown in FIG. 1. The output impedance matching network 118 also includes a third inductance connected in series with the output terminal 116 of the RF transistor 110 and the RF output port (RF_OUT), which corresponds to the second set 124 of electrically conductive bond wires 120 as shown in FIG. 1.

Advantageously, all of the capacitances of the output impedance matching network 118 are provided by a single capacitor, namely the first capacitor 112 as shown in FIG. 1. The physical configuration of the first capacitor 112 enables it to simultaneously provide the necessary capacitance for the first LC branch 202, as well as the necessary capacitance and inductance of the second LC branch 204. That is, even though the impedance matching network shown in FIG. 2 depicts includes first and second discrete, parallel LC branches, the first capacitor 112 can advantageously be configured to provide the necessary capacitance in both of these branches. This configuration advantageously reduces component count in comparison to conventional techniques that utilize two discrete capacitors and two sets of bond wires to form equivalently functioning LC branches.

The capacitance of the first LC branch 202 corresponds to the parallel plate capacitance of the first capacitor 112. That is, the capacitance of the first LC circuit corresponds to the capacitance that is measured between the upper metal plate 126 and the lower metal plate 130 of the first capacitor 112. Thus, the capacitance of the first LC circuit can be adjusted by appropriately tailoring the physical properties of the first capacitor 112, e.g., the area of the upper and lower metal plates 128, 130, thickness of the dielectric region 128, dielectric constant of the dielectric region 128, etc., in a conventionally known manner.

The capacitance and inductance of the second LC branch 204 are both provided by the upper metal plate 126 of the first capacitor 112. This is attributable to the fact that the upper metal plate 126 is configured as an open circuit transmission line from the perspective of the output terminal 116 of the RF amplifier. As is known in the art, an open circuit terminated transmission line presents a non-linear frequency response, due standing wave effects at the outer edges of the open circuit transmission line. This impedance response is dependent upon the physical properties of the open circuited conductor, e.g., length, width, shape, conductance, etc. By appropriately tailoring the physical properties of the upper metal plate 126, desired frequency response can be obtained. For example, the upper metal plate 126 can be physically tailored to provide a frequency response equivalent to that of a series resonator that provides an RF short at a higher order harmonics of the fundamental frequency in the manner previously discussed. Exemplary physical properties of the upper metal plate 126 that can be tailored to provide the desired frequency response include the area, dimensioning and geometry of the upper metal plate 126 of the first capacitor 112, as well as the dielectric properties of the dielectric region 128.

According to an embodiment, the dielectric region 128 of the first capacitor 112 includes a high-k dielectric constant material. As used herein, a high-k dielectric constant material refers to a material with a dielectric constant $\varepsilon_r$ of at least 100. According to particular embodiments, the high-k dielectric constant material has a dielectric constant in the range of 250-300, which is roughly equal to that of ceramic. By way of comparison, standard-k dielectric materials such as plastic, glass and silicon dioxide ($SiO_2$) have a dielectric constant $\varepsilon_r$ well below 100 (typically in the single digits) and are not considered a high-k dielectric constant material within the meaning of the term as used in present Specification. By using a high-k dielectric constant material for the dielectric region 128, it is possible to substantially reduce the size of the upper metal plate 126 of the first capacitor 112 while achieving the necessary impedance response for the second LC branch 204. In this way, footprint of the first capacitor 112 is compact enough to fit within the die attach area 108 of a variety of RF packages.

At the input side of the RF amplifier, the input impedance matching network 132 described with reference to FIG. 1 is represented by the plurality of inductors and capacitors connected between the RF input port (RF_IN) of the amplifier circuit and the input terminal 114 of the RF amplifier device. The input impedance matching network 132 includes a second capacitance 206 that is connected in parallel with the input terminal 114 and the reference potential terminal 117 of the RF amplifier device. In addition, the input impedance matching network 132 includes fourth and fifth inductances 208, 210 that are connected in series between the RF input port (RF_IN) and the input terminal 114 of the RF amplifier device.

The second capacitance 206 is provided by the two-terminal capacitance of the second capacitor 134. The inductances of the input impedance matching network 132 are provided by the electrically conductive bond wires 120. More particularly, the fourth inductance 208 is provided by the third set 136 of bond wires that is connected between the RF input terminal 114 and the second capacitor 134, and the fifth inductance 210 is provided by the fourth set 138 of bond wires that is connected between the second capacitor 134 and the input terminal 114 of the RF amplifier. The capacitance of the input impedance matching network 132 is provided by the second capacitor 134.

The input impedance matching network 132 is configured to provide impedance matching with respect to the input impedance of the RF amplifier device at the fundamental frequency of the RF signal. According to one technique, the parameters of the second capacitor 134 and the fifth inductance 210 are selected to form a parallel resonant circuit in combination with the parasitic input capacitance of the RF transistor 110 at the fundamental frequency in a similar manner as previously discussed regarding the output side of the amplifier device.

In the above example, a single first capacitor 112 is provided at the output side of the RF amplifier circuit to provide the dual function of impedance matching and RF filtering. Similar principles can be used at the input side of the RF amplifier circuit. That is, input impedance matching network 132 can include a capacitor that is constructed and designed according to similar techniques as the first capacitor 112, wherein this capacitor provides the function of the second capacitor 134 discussed and additionally provides the function of harmonic filtering.

A method of determining dimensions of a capacitor in an impedance matching network of an RF amplifier circuit will now be described. According to an embodiment of the method, an RF amplifier circuit 200 including the RF input port (RF_IN), the RF output port (RF_OUT), the reference potential port (REF), and the RF amplifier device as previously described with reference to FIG. 3 is provided. This RF amplifier circuit 200 may be implemented using the RF package and the RF transistor 110 described with reference to FIG. 1, for example. Additionally, one or more of the first capacitors 112 are provided. The first capacitors 112 can be configured according to either one of the embodiments described with reference to FIG. 2. The upper metal plate 126 or plates 126 of the first capacitor 112 are electrically coupled to a conductive transmission path of the RF signal between the RF input and RF output ports (RF_IN, RF_OUT). For example, the upper metal plate 126 or plates of the first capacitor 112 can be electrically connected to the output terminal 116 of the RF amplifier device as depicted in FIG. 1.

According to the method, the RF amplifier is operated to amplify an RF signal as between the RF input port (RF_IN) and the RF output port (RF_OUT) across an RF frequency range in the manner previously discussed. The RF frequency range can be any of a wide variety of frequency ranges. According to an embodiment, the RF frequency range is between 1.8 GHz and 2.2 GHz with a fundamental (center) frequency of 2.0 GHz. During amplification of the RF signal, an impedance presented by the one or more upper metal plates 126 is measured.

According to the method, the measurements of the impedance presented by the one or more upper metal plates 126 are used to determine a physical geometry for the one or more upper metal plate 126s that presents an RF short at a desired frequency. For instance, the technique can be used to determine what physical dimensions of the one or more upper metal plates 126 presents an RF short at the fundamental frequency (e.g., 2.0 GHz in the above example), or higher order harmonics of the fundamental frequency (e.g., 4.0 GHz, 6.0 GHz, 8.0 GHz, etc. in the above example).

According to embodiments of the method, various measurements of first capacitors 112 with differently dimensioned upper metal plates 126 are taken to extrapolate a relationship between the upper metal plate 126 dimensions and the open circuit impedance response of the first capacitor 112. That is, a correlation between the dimensional parameters of the upper metal plates 126 and the open circuit impedance response is determined. This can be done using an iterative process in which a plurality of the first capacitors 112 with varying physical properties are provided. For example, the plurality of the first capacitors 112 can include a number of first capacitors 112 in which the length and/or width of the of the one or more upper metal plates 126 varies from one another. In the embodiments in which the first capacitor 112 includes a plurality of discrete metal plates 126 (i.e., the embodiment of FIGS. 2C and 2D), the length and/or width of each of the discrete metal plates 126 can be uniformly varied for different ones of the first capacitors 112 in the plurality. For example, according to one technique, each one of the first capacitors 112 in the plurality has discrete metal plates 126 with the same width. The length of the discrete metal plates 126 varies as between different ones of the first capacitors 112, but not between different metal plates of the same first capacitor 112.

According to the iterative process, each of the first capacitors 112 in the plurality are provided in the RF amplifier circuit such that the upper metal plate 126 or plates of the first capacitor 112 are electrically coupled to the conductive transmission path of the RF signal between the RF input port (RF_IN) and RF output port (RF_OUT) in the previously described manner. Subsequently, the open circuit transmission line impedance for each of the first capacitors 112 in the plurality is measured. These measurements are used to extrapolate a relationship between the physical parameters of the upper metal plates 126 (e.g., length or width) and the open circuit transmission line impedance. For instance, a relationship between the length of the upper metal plate 126 and the change in minimum impedance point of the upper metal plate can be determined (e.g., 200 MHz/mm) with sufficient data points. This relationship can be used to tailor the first capacitor 112 to a particular amplifier circuit. For instance, if the frequency of operation of an amplifier circuit is known, the relationship can be used to construct a first capacitor 112 that will achieve a desired frequency response (e.g. filtering of higher order harmonics). Moreover, the relationship can be used for fine tuning amplifier circuits that are not behaving ideally by minor adjustments to the physical parameters of the upper metal plates 126.

The term "electrically connected" describes a permanent low-ohmic, i.e., low-resistance, connection between electrically connected elements, for example a wire connection between the concerned elements. An electrical connection is nominally a zero impedance connection. By contrast, the term "electrically coupled" contemplates a connection in which there is not necessarily nominally zero impedance connection between coupled elements. For instance, active elements, such as transistors, as well as passive elements, such as inductors, capacitors, diodes, resistors, etc., may electrically couple two elements together.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A packaged amplifier circuit, comprising:
an RF package, comprising: a metal flange, an RF input lead extending away from one side of the metal flange, an RF output lead extending away from an opposite side of the metal flange, and an electrically conductive die attach area between the RF input and output leads;
an RF transistor mounted in the die attach area, the RF transistor comprising: an input terminal that is electrically coupled to the RF input lead, an output terminal that is electrically coupled to the RF output lead, and a reference potential terminal that is electrically connected to the die attach area, the RF transistor being configured to amplify an RF signal as between the input and output terminals across an RF frequency range;
a first capacitor mounted in the die attach area, the first capacitor comprising: one or more upper metal plates, and a dielectric region between the upper metal plate and the die attach area; and
one or more first electrically conductive bond wires electrically coupling the upper metal plate of the first capacitor to a conductive transmission path of the RF signal between the RF input and RF output leads,
wherein the first capacitor is configured to simultaneously match an impedance of the RF transistor at a fundamental frequency of the RF signal and to filter a higher order harmonic of the fundamental frequency, the fundamental frequency being within the RF frequency range.

2. The amplifier circuit of claim 1, wherein an open circuit transmission line impedance of the one or more upper metal plates presents an RF short in the conductive transmission path at a higher order harmonic of the fundamental frequency.

3. The amplifier circuit of claim 2, wherein the higher order harmonic of the fundamental frequency is a second order harmonic of the fundamental frequency.

4. The amplifier circuit of claim 2, wherein the one or more first electrically conductive bond wires and the first capacitor collectively form a first LC circuit in parallel with the output terminal and the reference potential terminal of the RF transistor, the first LC circuit providing a parallel resonant circuit with an output capacitance of the RF transistor at the fundamental frequency.

5. The amplifier circuit of claim 4, wherein the open circuit transmission line impedance provided by the one or more upper metal plates forms a second LC circuit in parallel with the output terminal and the reference potential terminal of the RF transistor, the second LC circuit providing a series resonator at the higher order harmonic of the fundamental frequency.

6. The amplifier circuit of claim 4, wherein the first capacitor is mounted in the die attach area between the RF transistor and the RF output lead, wherein the one or more first electrically conductive bond wires are directly electrically connected between the output terminal and the one or more upper metal plates of the first capacitor.

7. The amplifier circuit of claim 4, wherein the first capacitor is the only discrete capacitor in the packaged amplifier circuit that is electrically connected to the output terminal of the RF transistor.

8. The amplifier circuit of claim 2, wherein the one or more upper metal plates comprise a single continuous metal plate that spans an entire length of the dielectric region.

9. The amplifier circuit of claim 2, wherein the one or more upper metal plates comprise a plurality of discrete metal plates that each cover a portion of the dielectric region and are separated from one another by gaps in which the dielectric region is not covered by a conductor.

10. The amplifier circuit of claim 9, wherein the packaged amplifier circuit further comprises one or more second electrically conductive bond wires electrically coupling the output terminal to the RF output lead, and wherein the one or more second electrically conductive bond wires extend over the first capacitor directly above the gaps that separate the plurality of discrete metal plates.

11. The amplifier circuit of claim 2, wherein the dielectric region comprises a high-K dielectric material.

12. An RF amplifier, comprising:
an RF input port;
an RF output port;
a reference potential port;
an RF amplifier device comprising: an input terminal that is electrically coupled to the RF input port, an output terminal that is electrically coupled to the RF output lead, and a reference potential terminal that is electrically connected to the reference potential port, the RF amplifier device being configured to amplify an RF signal as between the input and output terminals across an RF frequency range;
a first capacitor comprising one or more upper metal plates, and a dielectric region beneath the upper metal plate; and
one or more first electrically conductive bond wires electrically coupling the upper metal plate of the first capacitor to a conductive transmission path of the RF signal between the RF input and RF output ports,
wherein the one or more first electrically conductive bond wires and the first capacitor collectively form a first LC circuit in the conductive transmission path, the first LC circuit being configured to match an impedance of the RF transistor at a fundamental frequency of the RF signal, the fundamental frequency being within the RF frequency range, and
wherein an open circuit transmission line impedance of the one or more upper metal plates presents an RF short in the conductive transmission path at a higher order harmonic of the fundamental frequency.

13. The RF amplifier of claim 12, wherein the first LC circuit is in parallel with the output terminal and the reference potential terminal, and wherein the open circuit transmission line impedance provided by the one or more upper metal plates forms a second LC circuit in parallel with the output terminal and the reference potential terminal, the second LC circuit resonating at the higher order harmonic of the fundamental frequency.

14. The RF amplifier of claim 13, wherein the first capacitor is the only discrete capacitor connected to the conductive transmission path of the RF signal between the output terminal and the RF output port.

15. A method of determining dimensions of a capacitor in an impedance matching network of an RF amplifier circuit, the method comprising:
providing an RF circuit comprising an RF input port, an RF output port, a reference potential port, an RF amplifier device comprising: an input terminal that is electrically coupled to the RF input port, an output terminal that is electrically coupled to the RF output lead, and a reference potential terminal that is electrically connected to the reference potential port;
providing a first capacitor comprising one or more upper metal plates, and a dielectric region beneath the one or more upper metal plates;
electrically coupling the first capacitor to a conductive transmission path of the RF signal between the RF input and RF output ports;
operating the RF amplifier device to amplify an RF signal as between the RF input port and the RF output port across an RF frequency range;
measuring an impedance presented by the one or more upper metal plates during the operation of the RF amplifier; and
determining a physical geometry of the one or more upper metal plates in which the one or more upper metal plates presents an RF short at a frequency that is within or higher than the RF frequency range.

16. The method of claim 15, wherein a fundamental frequency of the RF frequency range corresponds to a center frequency of the RF frequency range, and wherein determining the physical geometry of the one or more upper metal plates comprises determining the physical geometry that presents an RF short at a second order harmonic of the fundamental frequency.

17. The method of claim 15, wherein the method comprises providing a plurality of the first capacitors, each of the first capacitors differing by at least one of length and width of the upper metal plates, and wherein determining the physical geometry of the one or more upper metal plates comprises:
measuring the open circuit transmission line impedance for each of the first capacitors in the plurality;
extrapolating a relationship between the length or width of the one or more upper metal plates and the open circuit transmission line impedance; and
determining a length or width value of the upper metal plates that presents the RF short at the frequency that is equal to or higher than the RF frequency range using the extrapolated relationship.

18. The method of claim 17, wherein, for each of the first capacitors in the plurality, the one or more upper metal plates comprise a plurality of discrete metal plates that each cover a portion of the dielectric region and are separated from one another by gaps in which the dielectric region is not covered by a conductor, and wherein a length of each one of the discrete metal plates is uniformly varied for different ones of the first capacitors in the plurality.

* * * * *